United States Patent [19]
Tsen

[11] 3,888,942
[45] June 10, 1975

[54] RESINOUS COMPOSITIONS AND LAMINATES MADE THEREFROM

[75] Inventor: Lo Kwang Tsen, Coshocton, Ohio

[73] Assignee: General Electric Company, Schenectady, N.Y.

[22] Filed: Dec. 13, 1973

[21] Appl. No.: 424,517

[52] U.S. Cl.... 260/830 TW; 260/47 EP; 260/37 EP
[51] Int. Cl............................................... C03c 25/02
[58] Field of Search............ 161/93, DIG. 4, DIG. 7, 161/151, 185; 117/72, 126 GB, 126 GE, 161 ZB; 260/830 TW, 47 EP

[56] References Cited

UNITED STATES PATENTS

| | | | |
|---|---|---|---|
| 2,989,500 | 6/1961 | Bauley et al. | 260/47 EA |
| 3,177,089 | 4/1965 | Marshall et al. | 117/72 |
| 3,177,090 | 4/1965 | Bayes et al. | 117/72 |
| 3,269,974 | 8/1966 | Childs | 260/830 TW |
| 3,477,990 | 11/1969 | Dante et al. | 260/47 EP |
| 3,547,881 | 12/1970 | Mueller | 260/830 TW |
| 3,647,726 | 3/1972 | Ulmer | 260/830 TW |

*Primary Examiner*—George F. Lesmes
*Assistant Examiner*—James J. Bell

[57] ABSTRACT

A particular mixture of epoxy resins and phenoxy resin along with curing agents, fillers and the like provides laminates for circuit boards characterized particularly by an improved Z-axis coefficient of expansion along with other desirable properties.

6 Claims, No Drawings

RESINOUS COMPOSITIONS AND LAMINATES MADE THEREFROM

This invention relates to particular mixtures of epoxy resins and phenoxy resin and to circuit boards or laminates prepared therefrom. More particularly, it relates to such resinous materials and laminates, the latter of which are particularly characterized by a very low Z coefficient of thermal expansion which makes them particularly useful in circuit board applications where heat cycling occurs in actual use. Where glass mat is used, the boards are readily punched.

Laminates prepared from glass fabric, glass mat or combinations thereof, or paper and the like, impregnated with epoxy and related resins, are well known. Such resins can be formulated to provide laminates and circuit boards which are characterized by good mechanical, electrical and solvent resistant properties along with good flame retardancy or resistance. Such resins have been particularly useful in providing circuit board bases and circuit boards in which the plating is resistant to cracking or failure under high temperatures experienced in soldering or making connections between the various elements of such boards. In making connections on a single board or between boards when they are tiered into module form, holes are usually drilled through the boards, such holes being plated or soldered and used to provide a route for desired electrical connections. Such resins have been blended to provide laminates of such hardness that on the one hand excessive drill wear does not occur in drilling such holes, and on the other hand provide a relatively hard circuit board which does not soften or warp under high temperature conditions.

In actual use, as in electronic equipment and other applications such as television sets, computers and the like, the circuit boards are subjected to rather severe thermal cycling which may range as high as 80° to 100°C and room temperature. Under such temperature cycling conditions, the circuit boards expand and contract, placing a strain upon the circuit board base itself and on the metallic components mounted thereon. It has been found that thermal expansion and contraction in the so-called Z-direction perpendicular to the circuit board and to the reinforcing material is particularly critical. When such expansion and contraction occur, there is a tendency for the through hole plating or soldering to fatigue and crack, breaking or changing the characteristics of the electrical connection of which it is a part such as resistance and capacitance.

It is a primary object of the present invention to provide resinous impregnating compositions and laminates and circuit boards made therefrom which are particularly characterized by a very low Z-coefficient of thermal expansion along with other desired characteristics such as good adhesion of plating to the board, good electricals, solvent and chemical resistance as well as suitably low thermal expansion in the X and Y surface-parallel axes. When glass mat is used, the boards are readily punchable and shearable.

Briefly, according to the present invention, there are provided epoxy base resinous compositions and curing system which, when used to prepare laminates and circuit boards, are particularly characterized by a low Z thermal coefficient of expansion along with other desirable characteristics. More particularly, the invention relates to a particular combination of resins, one component of which is a blend of epoxy resins of relatively high and low epoxy equivalent weight and phenoxy resin. The curing system consists essentially of tricarboxylic anhydride material such as trimellitic anhydride along with a tertiary amine curing catalyst or promoter. The composition is extended and its viscosity adjusted by the use of finely divided fillers along with suitable solvents and flame retardant materials as desired. Circuit board substrates treated or coated and impregnated with the present compositions are characterized by a very low Z-coefficient of expansion and other desired characteristics, both physical and electrical.

Those features of the invention which are believed to be novel are set forth with particularity in the claims appended hereto. The invention will, however, be better understood and further objects and advantages appreciated from a consideration of the following description.

Generally speaking, the epoxy resins of the present invention are prepared from the reaction of halohydrin and phenol. Such epoxy resins are typified by the reaction between epichlorohydrin and bis-(4-hydroxy phenyl)-2,2-propane (bisphenol-A), such materials generally being known as diglycidyl ethers of bisphenol-A. These epoxy resins can be represented by the formula

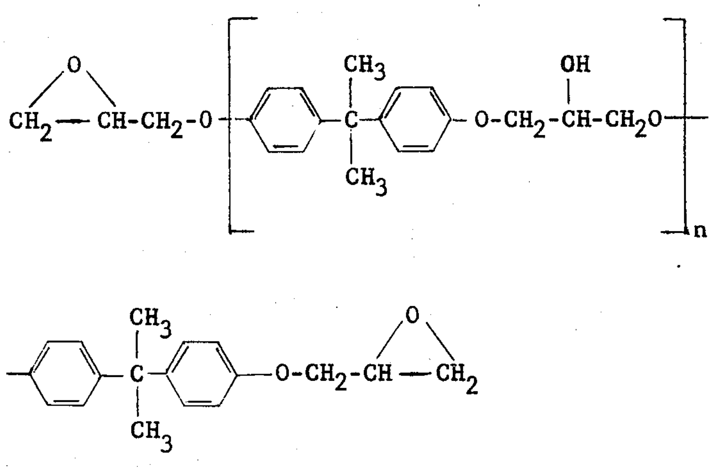

where $n$ has an average numerical value between 0 and about 7. Those skilled in the art will realize that other halohydrins and polyhydric phenols can be used. such epoxy resins are sold by Shell Chemical Corporation as Epon resin, by Ciba Company as Araldite resins, by Celanese Corporation as Epi-Rez resin, by Bakelite Company as ERL resin, and by Dow Chemical Company as D.E.R. resin. One epoxy resin constituent of the present resin mixture is a low epoxy equivalent resin typically prepared by reacting epichlorohydrin and bisphenol-A in the presence of sodium hydroxide or other suitable alkali metal catalysts, the proportions of reactants ranging from about 2 to 10 moles of epichlorohydrin per mole of bisphenol-A. The resulting epoxy resin is characterized by an epoxy equivalent weight of 170 to 200 where the value of n in the above formula is between 0 to 3. Such resins are commercially available as Epon 828, Epon 826, Epon 825, D.E.R. 332, D.E.R. 331, Epi-Rez 510 and Epi-Rez 5108.

Another epoxy resin constituent of the present invention is prepared by reacting the diglycidyl ether of bisphenol-A with a calculated amount of bisphenol-A or other suitable polyhydric phenol such as bisphenol-F, diphenol sulfone, and others which will occur to those skilled in the art, and preferably, where flame retardance is desired as in the present instance, halogenated bisphenol such as tetrabromobisphenol-A. The resulting epoxy resin which is preferably prepared by a fusion process such as that described in U.S. Pat. No. 3,477,990 desirably has an epoxy equivalent weight regulated to from about 900 to 1,900 and a functionality of about 2, and preferably 2. In the fusion process of the above patent, the diglycidyl ether of bisphenol-A is combined with tetrabromobisphenol-A and reacted along with an organophosphonium halide at about 150° to 200°C. Particularly useful as the diglycidyl ether is Epon 829 and D.E.R. 7030.6. Most preferably, the epoxy equivalent weight using tetrabromobisphenol-A of the fusion product ranges from about 1,200 to 1,900.

The phenoxy resins used in connection with the present invention are well known, such resins being generally prepared from equimolar weights of bisphenol material and epichlorohydrin or equivalent materials in an equimolar ratio. Such epoxy resins are described in *New Linear Polymers* by Henry Lee, Donald Stoffey and Kris Neville, published by McGraw-Hill Book Company, 1967, and are typified by Shell Chemical Company's Eponol 53 and 55 or their solutions, 53-B-40 and 55-B-40.

The curing agents used in connection with the present invention which have been found to impart to the finished product its desirable characteristics as described herein consist of tricarboxylic anhydride material. Any of a number of suitable tricarboxylic constituents which will occur to those skilled in the art can be used including 2,6,7-naphthalene tricarboxylic anhydride; 3,3′,4-diphenyl tricarboxylic anhydride; 3,3′,4-benzophenone tricarboxylic anhydride; 1,3,4-cyclopentane tetracarboxylic anhydride; 2,2′,3-diphenyl tricarboxylic anhydride; diphenyl sulfone-3,3′,4-tricarboxylic anhydride; diphenyl isopropylidene-3,3′,4-tricarboxylic anhydride; 3,4,10-perylene tricarboxylic anhydride; 3,4-dicarboxyphenyl 3-carboxyphenyl ether anhydride; 1,2,5-naphthalene tricarboxylic anhydride; etc. The tricarboxylic acid materials can be characterized by the following formula:

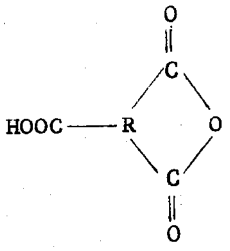

where R is a trivalent organic radical, preferably aromatic or cyclic.

Preferably, a curing promoter or catalyst is employed, such a material being typically a tertiary amine utilized in amounts of about 0.3 to 0.8 part by weight per 100 parts of resin solids. Preferred as the curing promoter is benzyldimethylamine (BDMA), although other materials such as 2,4,6-tris(dimethyl-amino methyl) phenol, hydroquinone-blocked triethylenediamine, 1-methyl imidazole and other similar materials can be used.

Also used in connection with the present invention to extend the material and impart desirable viscosity characteristics are finely divided fillers such as clays and the like including but not limited to Engelhard ASP-400-P clay, Monsanto Satintone-2 clay, the various fumed silicas known as Cab-O-Sil made by Cabot, finely divided titanium oxide such as Titanox manufactured by N-L Industries and antimony trioxide as a flame retardancy promoter. These fillers and additives are common and others will occur to those skilled in the art.

While, as pointed out above, preferably flame retardant diphenols such as tetrabromobisphenol-A are used in a part of the formulation, other flame retardant materials such as antimony trioxide can be used for this purpose or additionally. Generally speaking, according to the present invention, there are used, by weight, from about 50 to 90 percent, preferably 65 to 85 percent, of a low molecular weight epoxy resin typified by Epon 828, from about 10 to 50 percent, preferably 15 to 35 percent, of a special fusion epoxy resin described herein to form an epoxy resin composition. From 1 to 20 parts per hundred parts of epoxy resin composition, preferably 5 to 10 parts of phenoxy resin typified by Shell 55-B-40 are added. It has been found that from about 25 to 75 parts per hundred of epoxy resin composition, preferably 30 to 40 parts of tricarboxylic anhydride curing agent, such as trimellitic anhydride, are useful and from about 0.01 to 0.5 part per hundred parts of epoxy resin composition, preferably 0.05 to 0.2 part of curing promoter such as benzyldimethylamine is useful. The fillers can range from about 50 to 300 percent of the above total resin composition, preferably 50 to 100 percent, the flame retardants from about 0.5 to 10 percent, preferably 3 to 5 percent, based on the total resin composition. The thickener such as fumed silica and whitener such as titanium dioxide are included in the filler using amounts similar to the flame retardants. While any of a number of solvents can be used, such as acetone, methylethyl ketone and the like in proportions of from about 20 to 40 percent, preferably 25 to 30 percent of the total resin mixture plus additives, acetone has been found typically useful in this role.

The following examples are illustrative of the practice of the present invention, it being realized that they are not to be taken as limiting in any way.

Example 1

This example describes the preparation of the relatively high molecular weight fusion epoxy resin of the present invention. There were combined 212 parts by weight of Epon 829 and 227 parts of tetrabromobisphenol-A, the mixture being reacted at a temperature of about 175°C for ½ hour. The resulting fusion process resin had an epoxy equivalent weight of from about 1,350 to 1,450. This fusion product after cooling to 130°C was then combined with 275 parts of Epon 828, followed by solvent addition of 83 parts of methyl cellosolve and 204 parts of acetone.

Example 2

This example illustrates the preparation of the resinous composition of the present invention. Trimellitic anhydride was added as with mixing in the amount of 180 parts to 388 parts of acetone as a solvent. Then 400 parts of Epon 828 low epoxy equivalent weight epoxy resin, 283 parts of the fusion product of Example 1, and 90 parts of Eponol 55-B-40 phenoxy resin were added and mixed. Also added was 0.5 part of benzoyl dimethylamine. Used as a filler were 240 parts of ASP-40-P clay, 240 parts of Satintone-2 clay, 60 parts of Titanox titanium dioxide and 24 parts of Cab-O-Sil fumed silica. Added as a flame retardant material were 48 parts of antimony trioxide. After thorough mixing, the product was quite thixotropic and yet had high wetting power. The solid content was 73 percent by weight.

Example 3

Glass mat of 1.25 ounce per square foot weight was treated with the resin composition of Example 2, the resin pickup ranging typically from about 73 to 75 percent. Two layers of the impregnated glass mat were assembled into a layup and pressed in a hydraulic press at 300 psi from about room temperature to 125°C. The layup was then pressed with the pressure being raised to 200 psi at 125°C and finally cured at a pressure of 700 psi with the temperature at 150°C to 160°C for 20 minutes.

Example 4

Example 3 was repeated using 1 ounce per sq.ft. copper applied on one side of the laminates. The characteristics of the laminates of Examples 3 and 4 are shown below.

| | | Test Method | (N=NEMA) |
|---|---|---|---|
| Water absorption, | D/24/23 | 0.13% | NLI 1-10.12 |
| Flexural strength | L | 44000 psi | ASTM D790 |
| | C | 30300 psi | ASTM D790 |
| Dielec. Strength Paral. | S/S D48/50 | $60^s$–$70^s$–$68^s$ | ASTM D229 |
| Dielec. Const. | D24/23 | 4.57 | ASTM D150 |
| Dissipation Factor | D24/23 | .0195 | ASTM D150 |
| Surface Resistance | C/36/35/90 | $5 \times 10^6$ megohms | ASTM D257 |
| Vol. Resistivity | C/96/35/90 | | ASTM D257 |
| Peel A | | 12.0 | NLI 1-10.12 |
| Peel 500 F after 5 seconds | | 9 | NLI 1-10.12 |
| Expansion Coefficient X | | $11 \times 10^{-6}$ | in/in |
| Expansion Coefficient Y | | $35 \times 10^{-6}$ | in/in |
| Expansion Coefficient Z | | | |
| | 39–105°C | $60$–$82 \times 10^{-6}$ | in/in |
| | 105–128°C | $239 \times 10^{-6}$ | in/in |
| Dimensional Stability X | | −0.00006 | in/in |
| Dimensional Stability Y | | +0.00001 | in/in |
| Flame UL | | SE-O | |

The above Z expansion coefficient represents a substantial improvement over that attained using other usual resins, while at the same time retaining other desirable characteristics as shown.

What I claim as new and desire to secure by Letters Patent of the United States is:

1. A resinous composition comprising, by weight,
   a. an epoxy resin composition comprising a blend of about 50 to 90 percent of an epoxy resin having an epoxy equivalent weight of from about 170 to 200 and about 10 to 50 percent of the fusion reaction product of an epoxy resin and tetrabromobisphenol-A, said fusion reaction product having an epoxy equivalent weight of from about 900 to 1,900.
   b. from about 1 to 20 parts per hundred of the epoxy resin composition of (a) of a phenoxy resin,
   c. from about 25 to 75 parts per hundred of the epoxy resin composition of (a) of tricarboxylic anhydride, and
   d. from about 0.01 to 0.5 part per hundred of the epoxy resin composition of (a) of a tertiary amine curing promoter.

2. A composition as in claim 1 which additionally contains from about 50 to 300 percent by weight, based on the resinous composition of finely divided filler.

3. A composition as in claim 1 which contains an additional flame retardant in amounts of from about 0.5 to 10 percent by weight of the resinous composition of claim 1.

4. A composition as in claim 1 which contains from about 20 to 40 percent by weight of compatible solvent.

5. A circuit board substrate characterized by a low Z-axis coefficient of expansion under heat cycling, said substrate comprising at least one lamina treated with the resinous composition of claim 2.

6. A circuit board substrate as in claim 5 wherein said lamina is glass mat.

* * * * *